United States Patent
Weinholt

[11] Patent Number: 6,091,789
[45] Date of Patent: Jul. 18, 2000

[54] METHOD AND DEVICE FOR PHASE MODULATED SIGNALS

[75] Inventor: Dan Weinholt, Västra Frölunda, Sweden

[73] Assignee: Telefonaktiebolaget LM Ericsson, Stockholm, Sweden

[21] Appl. No.: 08/884,383

[22] Filed: Jun. 27, 1997

[30] Foreign Application Priority Data

Jun. 28, 1996 [SE] Sweden ................... 9602563

[51] Int. Cl.[7] ................... H04L 25/36; H04L 25/40; H04L 7/00
[52] U.S. Cl. ................... 375/371; 375/340
[58] Field of Search ................... 375/272, 279, 375/323, 284, 329, 334, 371, 377, 269, 273, 340; 329/300, 304

[56] References Cited

U.S. PATENT DOCUMENTS

| | | |
|---|---|---|
| 3,906,380 | 9/1975 | Querry et al. . |
| 4,042,884 | 8/1977 | Querry . |
| 4,071,829 | 1/1978 | Davis et al. . |
| 4,234,957 | 11/1980 | Tracey et al. . |
| 4,267,591 | 5/1981 | Wissel et al. . |
| 4,311,964 | 1/1982 | Boykin ................... 329/104 |
| 4,379,284 | 4/1983 | Boykin . |
| 4,555,667 | 11/1985 | Cressey et al. . |
| 4,613,976 | 9/1986 | Sewerinson et al. . |
| 4,712,221 | 12/1987 | Pearce et al. . |
| 4,866,395 | 9/1989 | Hostetter . |
| 4,896,336 | 1/1990 | Henely et al. . |
| 4,932,029 | 6/1990 | Heichler . |
| 4,942,592 | 7/1990 | Leitch et al. . |
| 4,959,619 | 9/1990 | Delacroix et al. . |
| 5,027,352 | 6/1991 | Goode . |
| 5,053,717 | 10/1991 | Schulz et al. . |
| 5,079,512 | 1/1992 | Muto . |
| 5,097,220 | 3/1992 | Shimakata et al. . |
| 5,136,616 | 8/1992 | Dent . |
| 5,272,447 | 12/1993 | Furuya et al. . |
| 5,440,259 | 8/1995 | Yokomura . |
| 5,440,267 | 8/1995 | Tsuda et al. . |
| 5,440,268 | 8/1995 | Taga et al. . |
| 5,475,705 | 12/1995 | Dent . |
| 5,568,096 | 10/1996 | Haartsen . |

FOREIGN PATENT DOCUMENTS

| | | |
|---|---|---|
| 135 301 | 7/1983 | European Pat. Off. . |
| 409 277 | 1/1991 | European Pat. Off. . |
| 517 533 | 12/1992 | European Pat. Off. . |
| 5-327803 | 12/1993 | Japan . |
| 5-347643 | 12/1993 | Japan . |
| 6-125370 | 5/1994 | Japan . |
| 6-261086 | 9/1994 | Japan . |
| 2 207 582 | 2/1989 | United Kingdom . |
| WO86/00767 | 1/1986 | WIPO . |
| WO96/37987 | 11/1996 | WIPO . |

Primary Examiner—Chi H. Pham
Assistant Examiner—Jean B Corrielus
Attorney, Agent, or Firm—Burns, Doane, Swecker & Mathis, L.L.P.

[57] ABSTRACT

A device and a method for deviation determination for use during transfer of a phase shift modulated information-carrying signal between a transmitter and a receiver. The deviation determination is based on the presence of phase-linear segments, i.e., parts of sequences of phase changes that have the same phase change. Segments having three or more consecutive phase changes of the same value are extracted. An identification of the filtered-out segments is performed in order to determine which nominal phase-linear sequences the segments belong to. After this, the deviation and possibly a correction signal can be determined.

38 Claims, 10 Drawing Sheets

METHOD AND DEVICE FOR PHASE MODULATED SIGNALS

BACKGROUND OF THE INVENTION

The present invention relates to a method and device for detecting and correcting modulation errors of an information-carrying modulated signal.

For the transfer of digital signals over longer distances between a transmitting unit and a receiving unit, it is suitable to code the digital signal in some way. The coding is done in order to ensure a reliable information transfer despite interference. For transfer by wire, one of the easiest forms of coding can be to increase the signal levels and a more advanced form can be some variation of phase shift or frequency shift of a carrier wave. The use of optical fibres for information transfer demands the use of a light source which is coded by the digital signals.

Transfer of information over wires or optical fibres is not always possible due to geographical positions, costs or other circumstances. In such cases it can be more suitable to use wireless transfer of the information, for example with the aid of some type of radio waves. Even in this case it is suitable to make use of a carrier wave which is modulated by the digital information.

The three basic methods of modulating a carrier wave with the aid of digital information are by means of a modification, a step, of either the carrier wave's amplitude, frequency or phase. The three basic methods of modulating a carrier wave are normally called amplitude shift modulation, frequency shift modulation and phase shift modulation respectively. Which method is used can be based on any of the following desires and/or requirements: detection performance, data speed, available spectrum/bandwidth, hardware complexity, frequency range, cost etc. Some of these requirements/desires conflict directly with one another, for which reason a prioritising dependent on the application has to occur. With amplitude shift modulation, the carrier wave's amplitude will vary, i.e. amplitude shift modulation does not have a constant envelope. Frequency and phase modulation both have a constant envelope which makes them insensitive to amplitude non-linearities which can occur in the transfer between a transmitter and a receiver. Examples of where amplitude non-linearities can occur are with the use of microwave radio links and satellite channels. Consequently, frequency and phase shift modulation are much more common than amplitude shift modulation.

Frequency shift modulation is most often the easiest to implement practically, i.e. the necessary hardware is simple both on the transmission side and on the receiving side, which gives low costs. Phase shift modulation on the other hand gives a better system in terms of performance, but requires a more complicated transmitter and receiver. Due to these differences, development has produced a type of hybrids which uses advantages from both modulation methods. Amongst these can be mentioned TFM (Tamed Frequency Modulation) and C-QPSK (Constant envelope offset Quadrature Phase Shift Key) which are basically the same modulation method, but which by virtue of the different names highlights the fact that it concerns a hybrid solution. With use of the modulation method, a physically simple transmitter is used similar to that used with frequency shift modulation and an advanced receiver similar to that used with phase shift modulation. In this way a system is obtained with advantages from frequency shift modulation, simpler and cheaper, and phase shift modulation, better performance.

However, certain problems arise when using modulation methods where the transmitter signal is generated by controlling a voltage-controlled oscillator (VCO) and where the signal is phase demodulated in the receiver. If a voltage-controlled oscillator is used to generate a modulated transmitter signal which is phase-modulated in a receiver, the requirement on the frequencies which the voltage-controlled oscillator generates are particularly high if a correct phase modulation is to be able to occur in the receiver. The requirements increase additionally with applications where the phase information over a number of information bits is used to generate a carrier wave frequency in the receiver, so-called coherent phase demodulation. The phase error is the same as the time integral of the frequency error.

With the generation of the transmitting signal's frequencies, a pulse shaper is used which converts the information-carrying signal, often a digital bit stream, into a modulating base band signal which controls the voltage-controlled oscillator. The level of the modulating base band signal defines which frequency the transmitter signal should have for a particular occasion. If the pulse shaper has an amplification error, which can be caused by temperature variations, aging of the components, bad initial adjustment of levels etc., this means that the voltage-controlled oscillator receives an incorrect input signal and as a consequence will generate incorrect frequencies. Due to amplification errors, the frequencies which are generated are scaled with a factor which is in relation to the amplification error. The scaling means that the width of the frequency spectrum which all the generated frequencies produce will reduce or increase to a degree which corresponds to the scaling.

The scaling can be illustrated in the following way: assume that the desired modulating base band signal has a range which lies between four and eight volts. If the amplification error gives rise to a factor of two, the input signal to the voltage controlled oscillator will lie between eight and sixteen volts. The output control range has thus not only moved, but also increased from four to eight volts and, in a similar way, the output signal's frequencies have thus changed. All of the frequencies have thus not increased the same amount, but instead the frequencies are scaled in relation to the amplification error. This creates an erroneous deviation of the output signal. By deviation is meant the instantaneous variation in the frequency from a carrier wave's envisaged centre frequency.

Problems with the frequency generation can also arise in the voltage-controlled oscillator, i.e. even in those cases where the modulating base band signal is correct, the voltage-controlled oscillator can generate the wrong frequency. The voltage-controlled oscillator can be marred with amplification errors which can be caused by temperature variations, aging of components, bad initial adjustment of levels and amplification factors etc. Here also, the generated frequencies will be scaled with a factor which is in relation to the amplification error.

In order to solve problems with generating correct frequencies, the transmitter can be provided with a deviation detector which measures the deviation of the modulated transmitter signal and thereby adjust the level of the base band signal in such a way that correct frequencies and thereby also correct modulation is obtained. In order to realise this, the transmitter is provided with a demodulator which demodulates the transmitter signal from the voltage controlled oscillator. The demodulated transmitter signal is then transferred to a deviation detector which detects the deviation and calculates the size of the amplification error and gives a deviation error constant. The deviation error constant is then used for correction of the level of the base band signal.

One problem that arises is how the deviation and the deviation error detection itself can be carried out in a reliable and simple manner. A large problem with deviation detection is when there is no indication about what the phase changes should be. A transmitter without a deviation detector can for example need a restructuring/upgrade with a deviation detector. A transmitter which previously had no deviation detector can be built up and integrated in such a way that it is not possible with a reasonable amount of work to obtain a signal with the digital information which is transferred via the transmitter, i.e. the digital information which is actually transmitted by the transmitter and which is not necessarily the same as the digital information which is supplied to the transmitter. If there is no possibility to obtain a signal with the digital information which is transferred into the transmitter, there is also no indication for supplying to a deviation detector concerning what the phase changes which are sent should be.

The deviation has to be able to be measured and corrected with sufficiently high accuracy in order, for example, that a coherent phase demodulation which is normally used is able to be performed.

One method of detecting the deviation and calculating the deviation error is to calculate the received phase changes per symbol and thereafter threshold-detect for a determination of the symbol's nominal phase change assignation. One symbol is the amount of information, one or more data bits, which a single phase change represents. This means that if the phase change per symbol is nominally $-90°(-\pi/2)$, $-45°(-\pi/4)$, $0°$, $45°(\pi/4)$ or $90°(\pi/2)$, it can be suitable to use $-67.5°$, $-22.5°$, $22.5°$ and $67.5°$ as threshold levels for determination of the phase change assignation. If the detected phase change is larger than $67.5°$ the nominal phase change is assumed to be $90°$. If the detected phase change lies between $22.5°$ and $67.520$ the nominal phase change is assumed to be $45°$. If the detected phase change lies between $-22.5°$ and $22.5°$ the nominal phase change is assumed to be $0°$ and so on. This is valid on the condition that no, or only a small, centre frequency error exists.

The method described above for detecting deviation errors has at least two essential problems, namely that it has a limited detection range and that the deviation detection is filter-dependent. If the deviation error is large, the threshold detection and therewith the deviation detection becomes erroneous. If the deviation error, which can be seen as a factorial error or scaling error, is less than 0.75 ($0.75·90°=67.5°$) or larger than 1.5 ($1.5·45°=67.5°$) the determination of phase assignation will be incorrect with threshold detection. The filter dependence arises due to the fact that transmitters and receivers normally comprise signal-adapted filters for optimising the signal/noise ratio and these filters affect, to a high degree, the detected phase change per symbol due to intersymbol interference. The effect is not symmetrical since it depends on the previous symbols and on the filters having low-pass characteristics. With a random sequence of data, the mean value of the detected phase changes is therefore reduced relative to a nominal theoretical mean value. This means that since the intersymbol interference is filter-dependent, the deviation detection also has an undesirable filter-dependence.

SUMMARY OF THE INVENTION

An object of the invention is to provide a method and a device by means of which the deviation of a phase shift modulated signal can be detected in a simple and reliable way.

Another object of the invention is to provide a method and a device by means of which a deviation detection can be performed with a large detection range and with a small intersymbol interference influence.

A further object of the invention is to provide a method and a device by means of which the deviation detection and correction of deviation errors can be performed in a receiver.

The above objects are achieved in accordance with a deviation detection principle according to the invention which uses the fact that certain modulation types can give rise to phase-linear sequences. This means that phase-linear segments occur, i.e. a part of a sequence, in the information-carrying phase shift modulated signals, with phase changes with consecutively the same phase change. It is here appropriate to explain certain expressions and words which will be used. A phase change is a value of how much the phase of a signal shifts from a previous value and this can also be zero. Normally, phase change per symbol is meant. A symbol is the amount of information which a single phase change represents. The amount of information can be one or more data bits. When using a phase shift modulation according to C-QPSK, which is used in the examples, the amount of information is one bit and thus it is a phase change per bit. A sequence consists of a number of phase changes. In a phase-linear sequence, all the phase changes are theoretically the same, and practically the phase changes are within a certain tolerance. A segment is a part of a sequence. Even in a phase-linear segment all the phase changes are theoretically the same, although in practice the phase changes vary somewhat. In order to be able to determine whether the phase changes in a segment are the same with a certain tolerance, the expression "determined same" is used, i.e. the device or method determines that the phase changes are the same despite the fact that they are not exactly the same numerically.

A detector which is based on the deviation detection principle according to the invention filters-out/extracts phase-linear segments from the information-carrying phase shift modulated signal and determines which nominal phase-linear sequences the filtered-out segments corresponds to. After the detector has determined which nominal phase-linear sequence the filtered-out phase-linear segment belongs to (is assigned to), the detector can determine which phase change the phase-linear segment should have, i.e. the phase change which the corresponding nominal phase-linear sequence has. With the knowledge of which phase change the phase-linear segment has and which phase change it should have, the detector can calculate the deviation of the information-carrying phase shift modulated signal and thereby also the deviation error and may possibly create a deviation error constant/correction signal.

The above-mentioned object can additionally be achieved by a method according to the invention for deviation detection of a phase shift modulated signal which comprises phase-linear sequences. According to the method, segments are first filtered-out with at least three consecutive values, where each value corresponds to a phase change from the phase shift modulated signal. The filtered-out segments are evaluated as to whether the consecutive values which correspond to phase changes in the segments are determined same viz, effectively the same and, if the values which correspond to phase changes in a segment are determined to be the same, a phase-linear segment of that segment is created and otherwise the segment is rejected. The filtered-out segments may possibly be evaluated as to whether they belong to a phase-linear sequence whose phase change per symbol is zero degrees and if a segment belongs to a phase-linear sequence whose phase change per symbol is zero degrees the segment is rejected. Thereafter the phase change assignation of the phase-linear segments is determined. The phase change assignation of the phase-linear segments is determined to be the same as the nominal phase change which the corresponding nominal phase-linear sequence possesses that the phase-linear segment is judged to be a part of. The deviation is calculated from the determined phase change assignation of the phase-linear segments.

The aforementioned object is additionally achieved by a device according to the invention for deviation detection of a phase shift modulated signal which comprises phase-linear sequences. The device comprises filter-out means, a first and possibly a second evaluation means, determination means and calculation means. The filter-out means filter-out/extract segments with at least three consecutive values which correspond to phase changes from the phase shift modulated signal. The first evaluation means evaluates whether the consecutive values which correspond to phase changes in the segments are determined same. If the values which correspond to phase changes in a segment are determined same, the first evaluation means creates a phase-linear segment of that segment and otherwise it rejects the segment. The optional second evaluation means evaluates whether filtered-out segments belong to a phase-linear sequence whose phase changes are zero degrees. If a segment belongs to a phase-linear sequence whose phase changes are zero degrees, the second evaluation means rejects the segment. The determination means determines the phase-linear segment's phase change assignation. The phase change assignation is determined to be the same as the nominal phase change which the corresponding nominal phase-linear sequence possesses that the phase-linear segment is judged to be a part of, i.e. it decides which phase-linear sequence the phase-linear segment corresponds to. The calculation means calculates the deviation from the phase-linear segment's determined phase change assignation and the phase-linear segment's consecutive values.

An advantage of the invention is that the deviation detector has a large detection range.

Another advantage of the invention is that the effect from intersymbol interference on the deviation detection can be made very small.

An additional advantage of the invention is that the principle of the deviation detector allows placement of a deviation detector according to the invention in either the transmitter or the receiver.

A further advantage of the invention is that it can be integrated in one or more circuits or implemented in a processor device and that it is not dependent on an extra demodulator in the case where it is implemented in the receiver.

DESCRIPTION OF THE FIGURES

The invention will now be described in more detail for an explanatory and by no means limiting purpose, with reference to the accompanying figures, in which.

DETAILED DESCRIPTION

Figure 1:
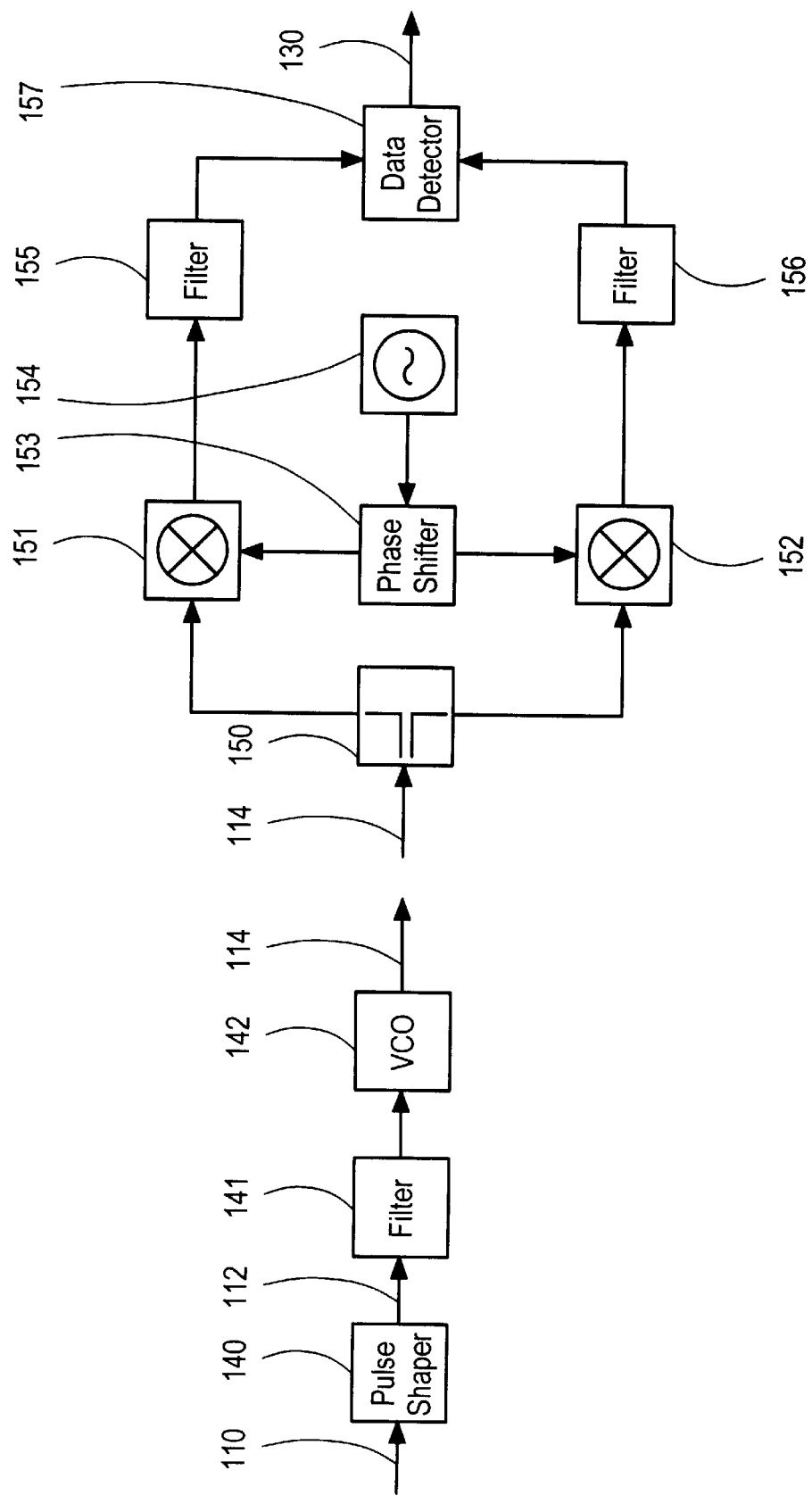
FIG. 1 shows a block diagram of a transfer system.

In order to aid understanding of the invention, a transfer system will be described, by way of introduction, in connection with FIG. 1. The transfer system according to FIG. 1 is an example of a system which can make use of a deviation detection according to the invention. Thereafter a transmitter and two receivers with deviation correction will be described in connection with FIGS. 2 to 4 where a deviation detector according to the invention can suitably be implemented. Firstly however it should be mentioned that the invention does not concern problems to do with detection and correction of centre frequency errors. Centre frequency errors consist, simply stated, only of a shift of frequencies (different frequencies are displaced/shifted by the same amount) whilst deviation errors are a scaling error which either pushes together or draws apart frequencies (different frequencies are displaced/shifted by different amounts).

FIG. 1 shows a block diagram of a system to which the invention is directed. An information-carrying signal 110, which can be a data bit stream, is converted in a pulse shaper 140 in order to create a modulating base band signal 112. The modulating base band signal 112 is, seen ideally, adapted so that it can control a voltage controlled oscillator 142 via a signal-adapted filter 141, in such a way that a modulated information-carrying signal 114 has a desired modulation and therewith also a desired deviation so that it can be decoded in a receiver. The signal-adapted filter 141 is preferably a low-pass filter for optimising the signal/noise ratio. The transfer of the information-carrying signal 114 to a receiver can occur via for instance a freely selectable wireless medium such as one or more radio channels, a microwave link, a satellite channel or via any other medium.

The receiver which is shown in FIG. 1 consists partly of a quadrature demodulator. The quadrature demodulator comprises a signal divider 150 which divides the modulated information-carrying signal 114 between an I-(In-phase) and a Q-(Quadrature-phase) channel. The information-carrying signals in the I- and Q-channels are demodulated, each one in its own demodulator 151, 152 with a demodulating frequency which is 90° phase-shifted between the channels. The demodulating frequency is generated in a signal generator 154 and is phase-shifted in a phase-shifter 153 in order to be able to supply the I- and Q-channels' demodulators 151, 152. The I- and Q-channels' demodulated information-carrying signals are fed, each by its own signal-adapted filter 155, 156, to a data detector 157 in order to recreate a copy 130 of the information-carrying signal 110.

As mentioned earlier it can happen that the level of the modulating base band signal 112 in FIG. 1 is not correct, due for example to amplification errors in the pulse shaper 140 or in the voltage controlled oscillator 142 which results in the modulation, the deviation, of the modulated information-carrying signal 114 being incorrect. In those cases where errors occur in the modulated information-carrying signal 114 it can happen that the data detector 157 cannot create a copy 130 of the information-carrying signal 110.

Figure 2:
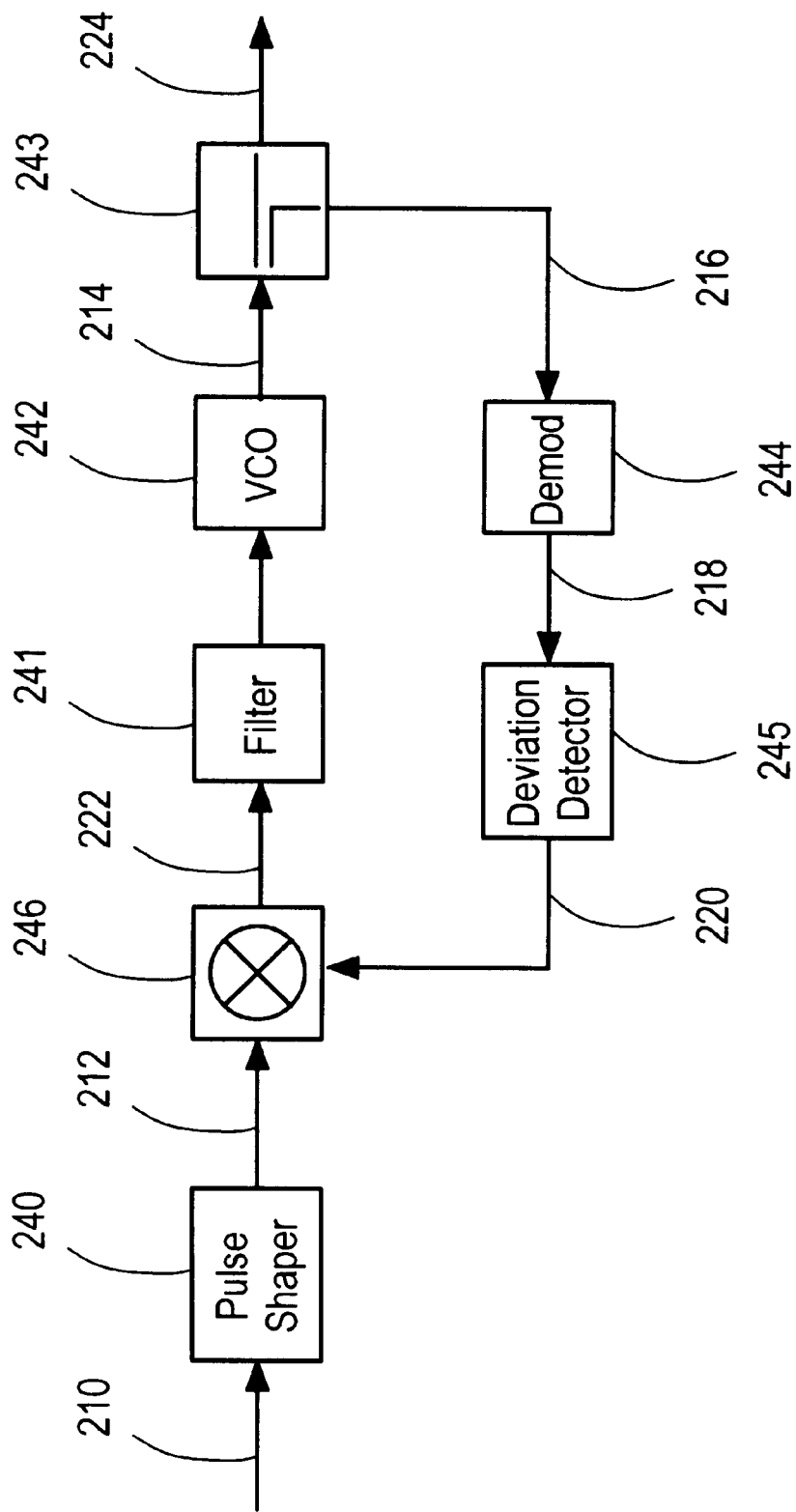
FIG. 2 shows a block diagram of a transmitter where an implementation of a deviation detector according to the invention is suitable.

A known solution for correcting the deviation is to correct the base band signal in the transmitter in order, in such a way, to obtain a correct deviation. FIG. 2 shows such a transmitter which advantageously uses a deviation detector according to the invention. An information-carrying signal 210 is here converted in a pulse shaper 240 in order to create a modulating base band signal 212. The modulating base band signal 212 is multiplied by a correction signal 220 (deviation error constant) in a multiplier 246 in order to generate a scaled modulating base band signal 222. The scaled modulating base band signal 222 controls, via a signal-adapted filter 241, a voltage controlled oscillator 242 which generates a modulated information-carrying signal 214.

The modulated information-carrying signal 214 is divided in a divider 243 whereby one part 224 is transmitted to a receiver and one part 216 is demodulated in a demodulator 244 in order to provide a deviation detector 245 in the transmitter with a demodulated information-carrying signal 218. The demodulated information-carrying signal 218 is supplied into the deviation detector 245 which measures the deviation of the demodulated information-carrying signal 218. The deviation detector 245 gives a measure, a deviation error constant in the form of the correction signal 220, of the amplification error. Since the modulating base band signal 212 is multiplied by the correction signal 220 in the multiplier 246, this gives a modified, or in other words the scaled, modulating base band signal 222. The scaled modulating base band signal 222 thereafter controls the voltage-controlled oscillator 242 in such a way that a modulated information-carrying signal 214 with the correct deviation is obtained.

This solution functions well from a technical point of view but is, especially due to the demodulator 244, expensive and requires much space in order to be realised. These disadvantages can be solved by, preferably, using a receiver according to any one of the FIGS. 3 or 4. A receiver according to FIGS. 3 or 4 together with a deviation detector according to the invention creates an optimised system.

Figure 3:
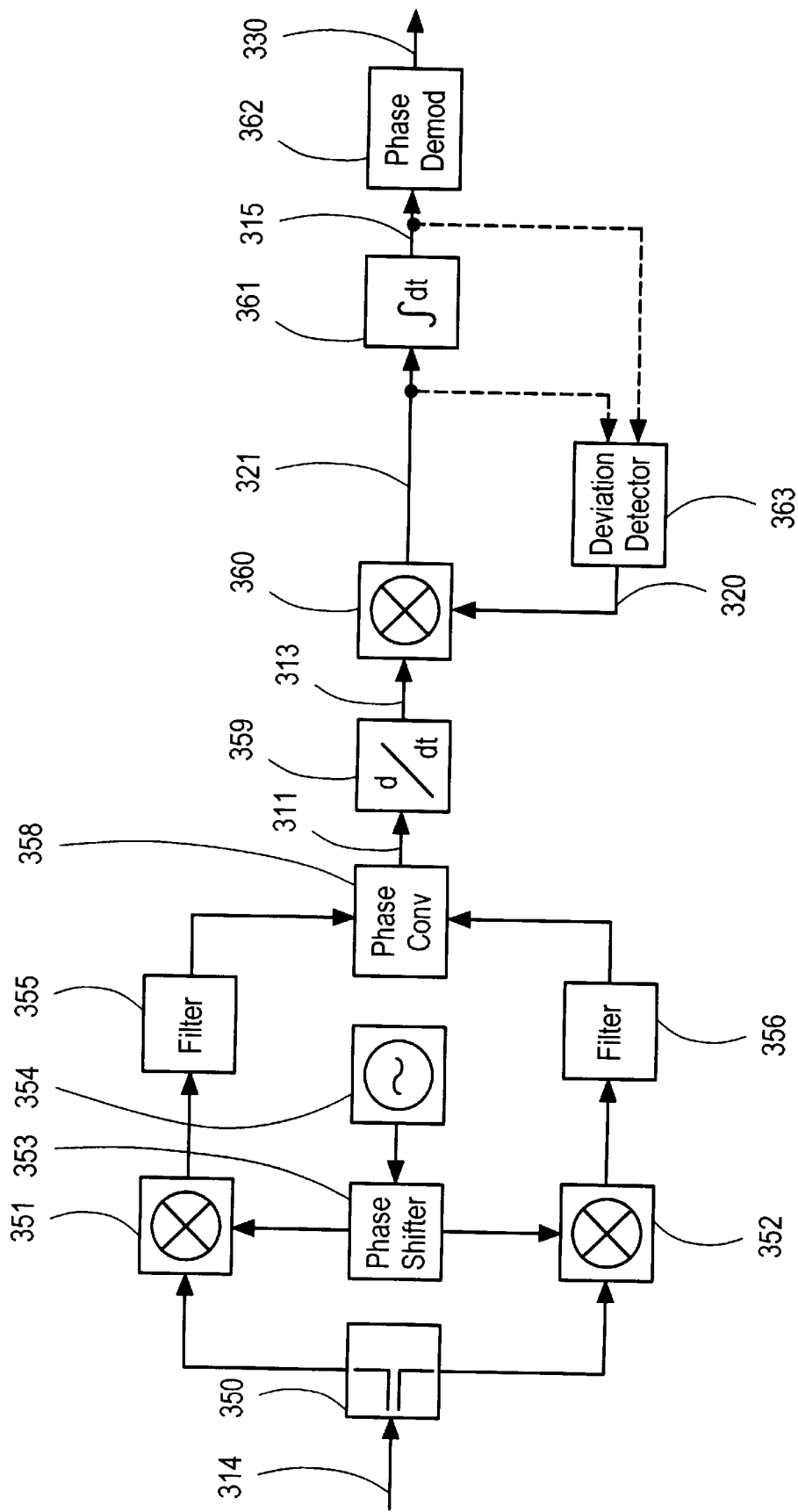
FIG. 3 shows a block diagram of a receiver where an implementation of a deviation detector according to the invention is suitable.

FIG. 3 shows a block diagram of a receiver which eliminates the above disadvantages which arise with the deviation detector and the deviation error correction only in the transmitter. A modulated information-carrying signal 314 can suitably be generated in a transmitter of the type which is shown in FIG. 1.

The modulated information-carrying signal 314 is first demodulated in a demodulator. The demodulator can be a quadrature demodulator similar to that shown in FIG. 1 but can also be of some other type. The modulated information-carrying signal 314 is first divided in a signal divider 350 which separates the modulated information-carrying signal 314 into an I- and a Q-channel. The information-carrying signals in the I- and Q-channels are demodulated, each in its own demodulator 351, 352 with a demodulation frequency which is 90° phase-shifted between the channels. The demodulation frequency is generated in a signal generator 354 and is phase-shifted in a phase shifter 353 in order to be able to be fed to the I- and Q-channels' demodulators 351, 352.

The I- and Q-channels' demodulated information-carrying signals are fed, each via its own signal-adapted filter 355, 356 to a phase converter 358 which gives an information-carrying phase signal 311. The information-carrying phase signal 311 is differentiated in a differentiator 359 in order to generate an information-carrying frequency signal, an instantaneous frequency value 313. It is necessary to obtain the instantaneous frequency value 313 in order to be able to correct the deviation.

Deviation errors which are detected and corrected by the invention have, for example, occurred due to amplification errors in the base band in connection with frequency generation of the modulated information-carrying signal 314, for which reason correction is made on a signal in the base band.

The instantaneous frequency value 313 is multiplied in a multiplier 360 with a deviation error constant in the form of a correction signal 320 whereby a scaled information-carrying frequency signal, an amplitude-scaled signal 321, is created. The amplitude-scaled signal 321 is integrated in an integrator 361 in order to give a scaled information-carrying phase signal, a scaled phase signal 315 which can be phase-demodulated in phase demodulator 362, which thereby recreates a copy 330 of the information-carrying signal.

The correction signal 320 is generated by a deviation detector 363 which is suitably a deviation detector according to the present invention, (see the following description). The deviation detector either detects the deviation of the modulated information-carrying signal 314 via the amplitude-scaled signal 321, via the scaled phase signal 315 or via a combination of both.

By incorporating deviation detection and deviation correction in a receiver, the necessity of having a demodulator in the transmitter, which occurs if the deviation detection is placed in the transmitter, can be avoided. Additional advantages are achieved as well since, in principle, the whole receiver with the deviation detector, with the exception of possibly the high frequency parts, can be incorporated in one or more integrated circuits.

Figure 4:
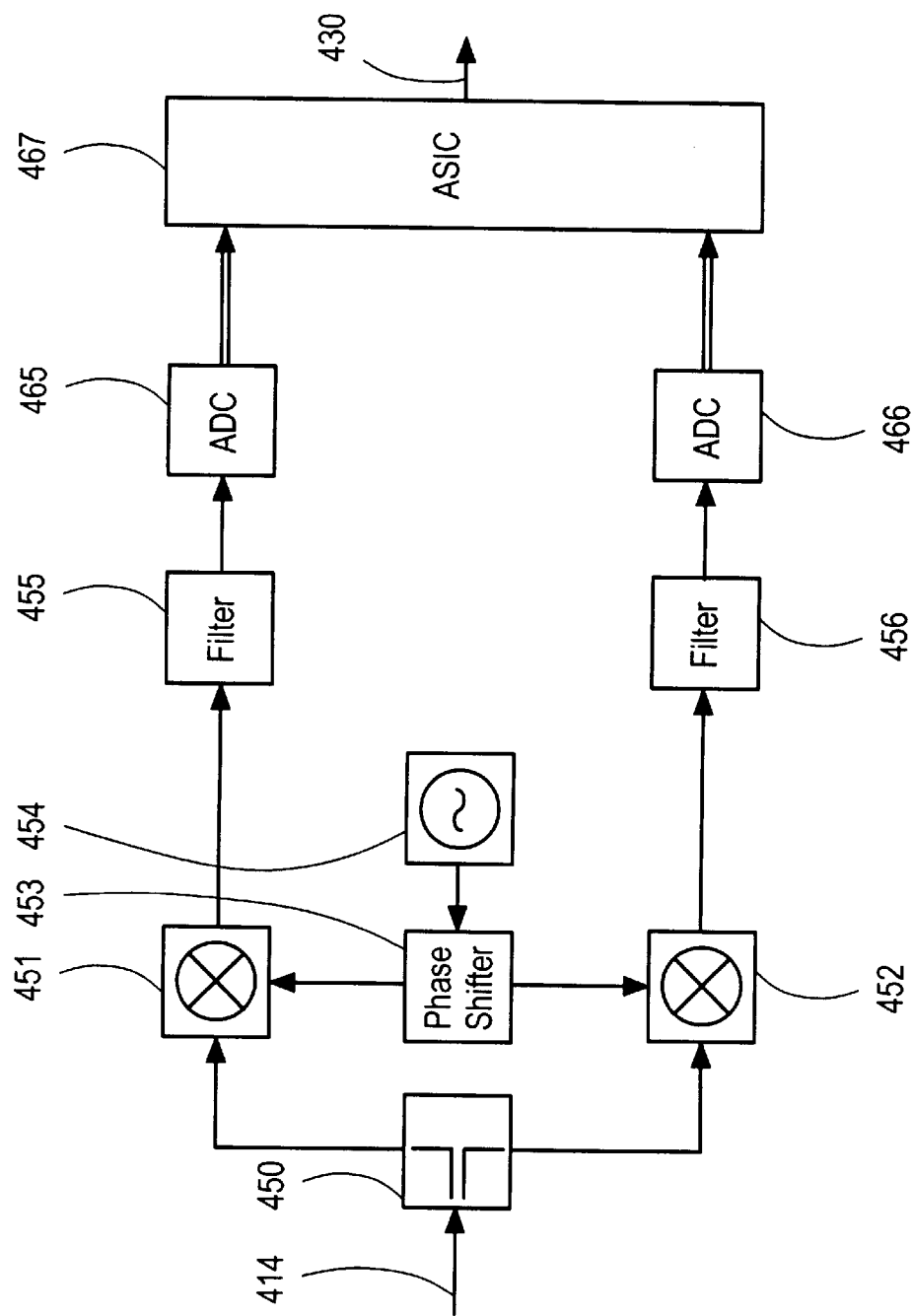
FIG. 4 shows a block diagram of a further receiver where an implementation of a deviation detector according to the invention is suitable.

FIG. 4 shows a block diagram of a further receiver which advantageously uses a deviation detection according to the invention. In this receiver also, a modulated information-carrying signal can be generated in a transmitter of the type shown in FIG. 1 where an information-carrying signal 110 is converted in a pulse shaper 140 which in turn controls a voltage controlled oscillator 142 via a filter 141. This receiver also makes use of a quadrature demodulator but of course some other type of demodulator can replace it.

As previously, a modulated information-carrying signal 414 is divided in a divider 450 into an I- and Q-channel, demodulated with the aid of the demodulators 451, 452, signal generator 454 and phase shifter 453. After demodulation the I- and Q-channel are each filtered in their own signal-adapted filter 455, 456 and then the signals in the I- and Q-channels are analogue/digital converted, each in their own analogue/digital converter 466, 465, the digital outputs of which supply a digital customer-specified integrated circuit 467 (ASIC-Application Specific Integrated Circuit).

The placement of the analogue to digital interface is of course not limited to the placement which is shown in FIG. 4. The placement of the interface normally depends on the processing speed of the available digital technology. The interface is preferably placed as far as possible towards the modulated information-carrying signal 414 and, in an ideal case, possibly only after some type of receiver amplifier.

With today's available technology a placement of the interface after demodulation is most suitable, especially in those cases where the modulated information-carrying signal is within the microwave range or higher.

The digital customer-specified circuit 467 comprises most of the functions from FIG. 3, i.e. the functions of a phase converter 358, a differentiator 359, a multiplier 360, an integrator 361, a phase demodulator 362 and a deviation detector 363. As an output signal, the circuit suitably generates at least a copy 430 of the information-carrying signal 110.

The functions in the digital customer-specified circuit 467 according to FIG. 4 can of course also be realised with the aid of a number of customer-specified circuits or a number of standard circuits or a mixture of customer-specified circuits and standard circuits. The functions can also be a small part of a larger customer-specified circuit which includes other necessary functions for the receiver. In cases where the modulation methods and the data speed allow it, the digital customer-specified circuit 467 can be replaced with one or possibly more processor devices. A processor device normally comprises of one or more calculation units (processors), memory means for both programs and data and additionally some sort of input and output units. The processor device(s) do not of course have to be dedicated only to the above functions.

A possible expansion of a system with deviation correction in the receiver is to transmit information about the correction signal to the transmitter of the modulated information-carrying signal via for example a data channel. Since most communication links are bi-directional in some form, an adjustment can therefore be made to the modulating base band signal in the transmitter. The adjustment can be performed by the transmitter being provided with a multiplier according to that shown in FIG. 2 but which instead is supplied with a signal which was sent via for example a data channel from the deviation detector in the receiver. A variation is to let information about deviation errors be transferred to the transmitter where a rough adjustment is made and only perform a fine adjustment in the receiver.

As mentioned earlier, one method of detecting the deviation and calculating deviation errors is to calculate the received phase change per symbol and thereafter threshold detect in order to determine which nominal phase change assignation the symbol should have. The known method for detecting deviation errors has, as mentioned, at least two essential problems, namely that it has a limited detection range and that the deviation detection is filter-dependent.

The invention overcomes the problems, faults and limitations which are described above that conventional deviation detectors present. The invention aims at providing a deviation detector and a method for deviation detection which presents a large detection range and a detection with a small filter influence. The invention also presents other advantages which will become evident in the further description. The deviation detection according to the invention is suitable for use, inter alia, in radio communication, mobile telephony, the satellite area and microwave links on both the transmitting and the receiving side. In order to clarify the deviation detection according to the invention, some examples of its use will be described below in connection with FIGS. 5 to 10.

The problem with deviation/deviation error detection is, as mentioned, greatest when there is no indication as to which nominal phase changes the transferred phase changes should possess as in the preferred case with the deviation detection in the receiver. The information-carrying signal behaves randomly for the deviation/deviation error detector (the detector) since the sequence of phase changes are not known by the detector. The detector has no information about what the phase changes should be. For a reliable transfer of information, it has to be possible to measure the deviation and thereafter, possibly, correct it with sufficiently high accuracy in order, for example, that a coherent phase demodulation can occur.

Figure 5:
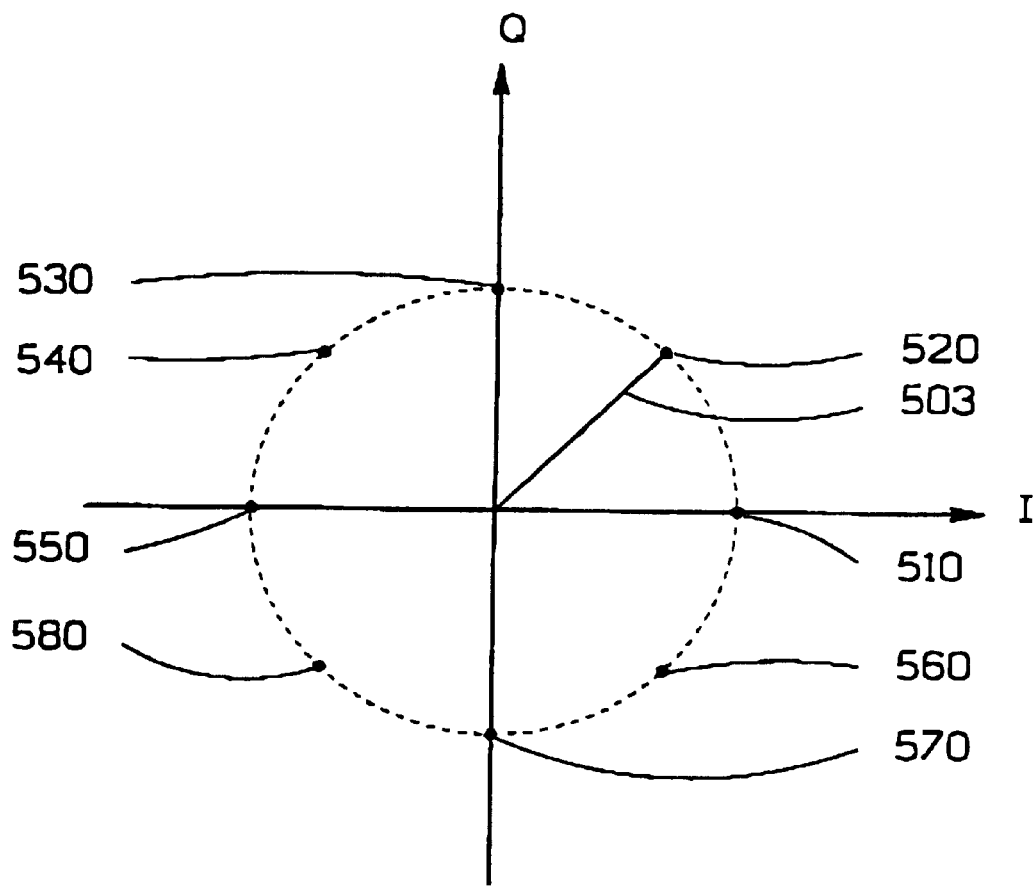
FIG. 5 shows a phase diagram.

Since the detector does not have information about which phase changes are coming, it must in some way be able to identify the phase changes in order to determine the deviation and thereby also the deviation error. FIG. 5 shows a polar phase diagram of the eight different nominal normalized phases with phase shift modulation according to C-QPSK. The amplitude 503 is the same for all the different signal phases (phase angles) at 0° 510, +45° 520, +90° 530, +135° 540, +180° 550, −45° 560, −90° 570 and −135° 580. The signal phases are thus at ±n 45°, where n is a whole number. The phase change per symbol can be either −90°, −45°, 0°, +45° or +90°. The invention is in no way limited to the transfer using a phase shift modulation according to C-QPSK. Other types of modulation can of course include other phase-linear sequences. The detector according to the invention uses the fact that segments of phase-linear sequences occur in the information-carrying signal, i.e. segments of sequences which have phase changes with consecutively the same phase change. The only limitation which the invention puts on the transfer method is that there must be distinguishable phase-linear sequences.

Figure 6:
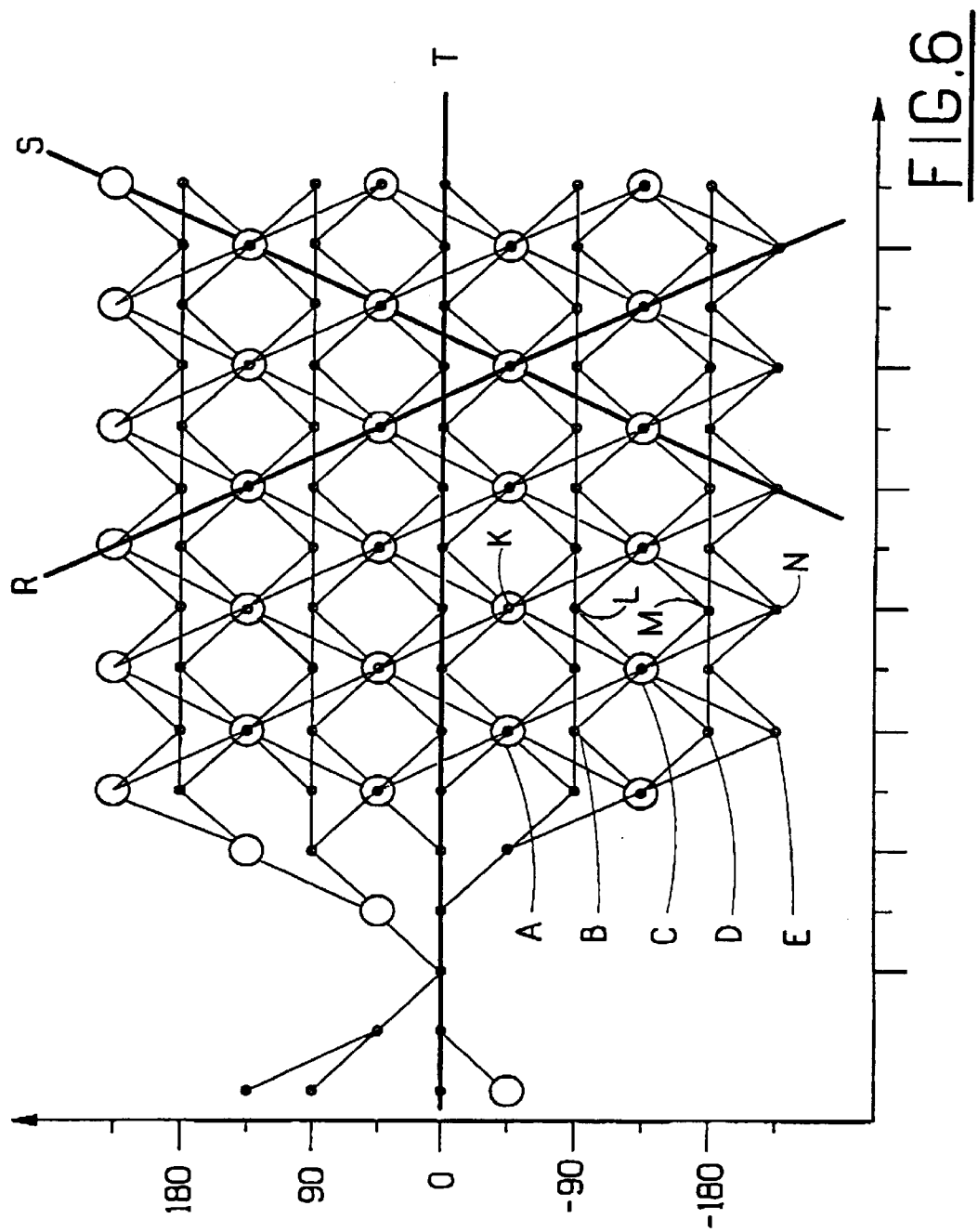
FIG. 6 shows a phase tree.

FIG. 6 shows purely schematically a part of one suitable phase tree for the invention, from many possible ones, which the modulated information-carrying signal 114 in FIG. 1 suitably follows, in an ideal case. The phase tree shows the relationship between two consecutive signal phases according to the relationship:

$$\phi_n = \phi_{n-1} + \pi/8 \, (a_n + 2a_{n-1} + a_{n-2}) \quad (1)$$

where:

$a_n$ corresponds to consecutive input data which can assume whole number values which belong to the set $\{1;-1\}$;

$a_{n-1}$ corresponds to the previous input data before $a_n$;

$a_{n-2}$ corresponds to the even earlier input data before $a_{n-1}$;

$\phi_n$ corresponds to the searched signal phase;

$\phi_{n-1}$ corresponds to the previous signal phase.

FIG. 6 shows how the signal phase nominally can change over time. As is clear from the relationship (1), the signal phase can only be changed along the lines. In the phase positions 45° +n· 90° (n=a whole number), which are marked with circles, the phase can only proceed with same sign of the first derivative (slope). This means that if the signal phase is at point C, the next signal phase is not freely selectable amongst the points K, L, M and N but is limited by what the previous signal phase was. According to the relationship (1) (and also the phase tree), the signal phase after signal phase C can only result in any one of the signal phases M or N if the signal phase was any of the signal phases A or B before the signal phase C. In a corresponding way, the signal phase after the signal phase C can only result in any one of the signal phases K or L in those cases where the signal phase was either D or E before the signal phase C.

According to the relationship (1), which can be seen in FIG. 6, only three different sequences are formed with consecutively the same phase change, namely sequences with −90° phase change per symbol for instance according to line R, sequences with +90° phase change per symbol for instance according to line S, and the sequence according to line T with 0° phase change per symbol. The deviation error detection according to the invention uses only −90° (for example according to line R) and +90° (according to line S) sequences for deciding upon phase assignation and calculation of the deviation, deviation error and a deviation error constant.

Figure 7:
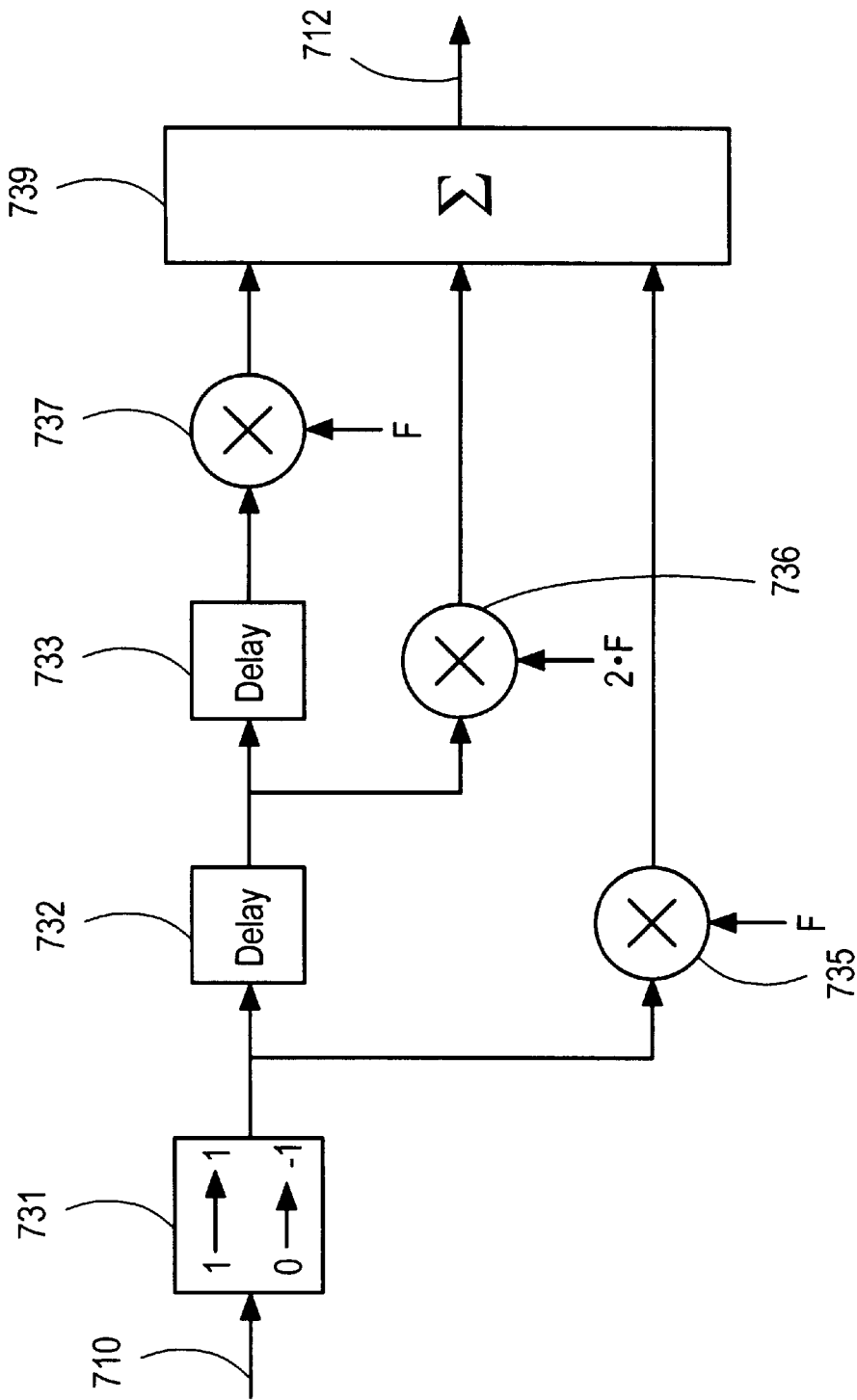
FIG. 7 shows a block diagram of a pulse shaper for generating a modulating base band signal.

In order to realise the relationship (1) and therewith generate the phase tree according to FIG. 6, a pulse shaper according to FIG. 7 can be used for example. The pulse shaper according to FIG. 7 first converts the information-carrying signal's digital data 710 in a converter 731 where:

1 is converted to +1 and 0 is converted to −1.

Then the signal is divided into two parts, of which one part goes to a first delay unit 732 which delays the signal with a symbol time and a second part goes to a first multiplier 735. The first multiplier 735 multiplies the signal by a factor F.

The output signal of the first delay unit 732 is divided further into two parts, of which one part goes to a second delay unit 733 which also delays its input signal one symbol time and a second part goes to a second multiplier 736. The second multiplier 736 multiplies its input signal by a factor 2F. The signal out of the second delay unit 733 goes only to a third multiplier 737. The third multiplier 737 multiplies its input signal by the factor F. The size of F depends on, amongst other things, the sensitivity of the later voltage controlled oscillator. In the shown example, F is equal to 1 which gives the multiplication factors 1, 2 and 1 respectively.

The output signals from the multipliers 735, 736, 737 goes to a summation unit 739 which adds the input signals and thereby generates the modulating base band signal 712. The first part of the relationship between two consecutive signal phases has thereby been realised, namely:

$$a_n + 2a_{n-1} + a_{n-2} \quad (2)$$

The modulating base band signal 712 can thus ideally assume the values $\{-4, -2, 0, 2, 4\}$. The VCO sensitivity in this case is to be adapted in such a way that if the modulating base band signal 312 has the amplitude $\{4\}$ the accumulated signal phase of the VCO-signal should be 90° ($90°=\pi/2=\pi/8\cdot4$) during one symbol time.

If the phase shift modulation of the information-carrying signal occurs according to the phase tree in FIG. 6 and for example a pulse shaper according to FIG. 7, there are only three different sequences with consecutively the same phase change. These can be seen in FIG. 6 as line T and also for example line R and S as mentioned above. The phase change per symbol for these sequences is 0 degrees, −90 degrees and +90 degrees as nominal values.

Three or more consecutive phase changes with the same phase change, i.e. phase-linear segments, in the modulated information-carrying signal have to belong to any one of the three phase-linear sequences with nominally −90°, 0 or +90 degrees per symbol. The detector only makes use of the occurrence of the nominal phase-linear sequences with phase changes of −90 degrees per symbol and +90 degrees per symbol which occur in the modulated information-carrying signal according to the example. The detector filters-out/extracts phase-linear segments and determines which nominal phase-linear sequences the filtered-out segments correspond to. Since only the nominal phase-linear sequences with −90 and +90 degrees nominal phase change per symbol are used in the example, in the ideal case it is only necessary to perform an identification/threshold-determination of whether it is a positive or a negative phase change, in order to determine which phase-linear sequence it is. When the detector has determined which nominal phase-linear sequence the filtered-out phase-linear segment belongs to, it can, with knowledge about which phase change the phase-linear segment has and which phase change it should have, calculate the deviation and the deviation error and possibly create a deviation error constant, i.e. a correction signal.

One reason for not using 0 degrees phase-linear sequences is that it is not possible to calculate the deviation nor deviation errors or correction signals from these 0 degrees phase-linear sequences. In a case without centre frequency errors and without noise but with a deviation error, 0 degrees phase-linear sequences will always have 0 degrees phase changes, independent of the size of the deviation error. The phase changes in a nominally +90 degrees phase-linear sequence with deviation errors will not be +90 degrees, but can for example be +45°, +23°, +67° or +123°, all being dependent on the size of the deviation error.

Most of the following examples of methods and devices according to the invention only deal with filtering-out/extraction of phase-linear segments which belong to nominal phase-linear sequences with +90 degrees nominal phase change per symbol. Naturally, a filtering-out/extraction of segments which correspond to nominal phase-linear −90 degrees sequences is also done and this happens in a way which totally corresponds to that for filtering-out/extracting of segments which belong to +90 degrees sequences, for which reason this will not be described in detail. By a filtering-out/extraction of segments of both sequence types, a better calculation of the deviation and therewith the deviation error can be made.

The filtering-out/extraction suitably occurs by forming phase-linear segments of a desired length, being however longer or the same as three phase changes, of determined same consecutive phase changes. It is only the phase-linear sequences which have three or more consecutive phase changes that are the same. The consecutive phase changes in the formed phase-linear segments being determined same does not mean that the consecutive phase changes have to be exactly the same. It does mean though, that the phase changes must be within a predetermined divergence from one another. In this application, such phase changes are called "determined same" or "effectively the same". The phase changes additionally have to be distinct from zero, since 0 degrees phase-linear sequences are not used. The phase changes proximate and equal to zero degrees are filtered away. The detector compares the formed phase-linear segments with threshold values in order to determine the assignation of the phase change. Positive formed segments belong to (are assigned to) +90 degrees phase-linear sequences and negative formed segments belong to −90 degrees phase-linear sequences.

If the centre frequency error is small the threshold determination for the phase change's assignation can be set close to zero degrees which means a large detection range of deviation errors. For instance, having a centre frequency error which gives rise to a phase shift of 5° per symbol the threshold-determination of the phase change's assignation can be set at 10 degrees per symbol. Compared to the prior art method described above with fixed threshold comparisons for determination of the phase change's assignation, a detector according to the invention has a large detection range. The deviation error, which can be seen as a factorial error or scaling error, can, in this example with a detector according to the invention with a threshold-determination of the phase change's assignation at 10 degrees, be allowed to be as small as 0.12 (0.12·90°>10°) before errors occur in the determination of the phase assignation. A detector according to the invention has in principle no upper limit but if the phase changes are larger than or equal to 180 degrees it is required that the detector measures the phase changes sufficiently quickly in order to be able to determine if the phase changes go clockwise (−) or anticlockwise (+). In most cases it is however sufficient if the detector can handle phase changes which are less than 180 degrees. With the aforementioned conditions and an upper limit on the phase changes of 180° a detector according to the invention copes with deviation errors with an upper limit which is 1.88 (1.88·90°<170°). As mentioned, the prior art method with fixed threshold comparisons for determination of the phase change's assignation has a lower limit of 0.75 (0.75·90°= 67.5°) and an upper limit of 1.5 (1.5·45°=67.5°) for a tolerable deviation error before errors occur in the determination of the phase assignation.

According to a basic method of the invention a determination is made as to whether phase changes or the values which correspond to phase changes in a segment are determined same, for forming phase linear segments, by testing a phase change or a value which corresponds to a phase change in the segment as to whether it is within a given range. The range's limits are defined by a maximum allowed spread from a previous phase change in the segment or a previous value which corresponds to a phase change in the segment. A variation of the invention is that the limits of the range are defined by a maximum allowed spread from a mean value of all phase changes or the values which correspond to phase changes within the segment.

The intersymbol interference in a signal-adapted filter has a finite length in time. Intersymbol interference arises with an alteration in the following phase change. Intersymbol interference will therefore have a finite length around the start and end of a phase-linear segment. By selecting and filtering-out/extracting and forming sufficiently long phase-linear segments and then selecting a part, preferably a middle part, of these formed phase-linear segments for calculating the detected phase change per symbol, the filter influence on the deviation detection can be made, in principle, arbitrarily small. However, the probability of being able to filter-out phase-linear segments from the information-carrying signal is reduced the longer the desired segment. The segment length is a compromise between the accuracy and the time it takes to be able to filter-out a segment with a desired length. This can typically be suitable with a formed phase-linear segment length which is longer than five phase changes. Preferably, a formed phase-linear segment eight phase changes long is suitable. With the use of an eight phase changes long segment, the two phase changes closest to the middle are preferably used. In order to calculate the deviation and therewith also the deviation error it is suitable to then calculate the mean value of these phase changes which are closest to the middle in the segment.

Figure 8:
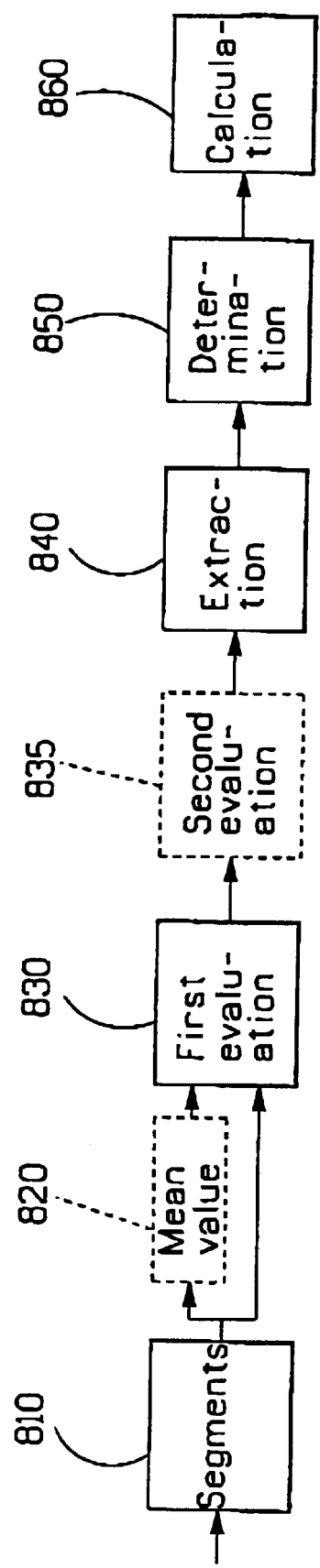
FIG. 8 shows a block diagram of a deviation detector according to the invention.

FIG. 8 shows a simple block diagram of one variation of a deviation-/deviation error detector according to the present invention. The detector obtains for instance its input signals, according to FIG. 3, suitably from the modulated information-carrying signal 314 via an amplitude-scaled signal 321 or a scaled phase signal 315 or a combination of both. Firstly segments of the signal are formed in the segment-forming block 810 which comprises means for forming phase change segments of desired length. The forming of the segment may possibly occur with the aid of means for series to parallel conversion which includes a shift register. For each new segment which is formed a new phase change is shifted into the shift register and a segment with the determined length is extracted from the series to parallel converter.

Thereafter an optional mean value block 820 with mean value means may form a mean value of the phase changes in a formed phase change segment. A phase change segment and possibly a corresponding optionally formed mean value are fed into a first evaluation block 830. The first evaluation block 830 comprises means for evaluating whether all phase changes in the segment are within a determined maximum spread from one another or from the optionally formed mean value. If all phase changes in the segment lie within the maximum spread it is judged (decided) that the segment is a phase-linear segment and it is thereby sent to the extraction block 840. If, on the other hand, not all phase changes in the segment lie within the maximum spread, the segment is judged as non-phase-linear and is rejected in its entirety. After the first evaluation block 830 comes an optional second evaluation block 835. The second evaluation block 835 comprises means for evaluating whether formed segments belong to a phase-linear sequence whose phase changes per symbol are zero and if a segment belongs to a phase-linear sequence whose phase changes per symbol are zero degrees, the segment is rejected. The second evaluation block 835, if it is included, can also be placed after the extraction block 840 or a determination block 850.

The extraction block 840 extracts one or several phase changes in the middle of the segment in order to reduce the effect of intersymbol interference (see above). Following this is the determination block 850 which uses the values from the extraction block 840 for making a determination of phase change assignation. Lastly there is a calculation block 860 which performs a calculation of the deviation and possibly the deviation error with the aid of calculation means belonging thereto.

Figure 9:
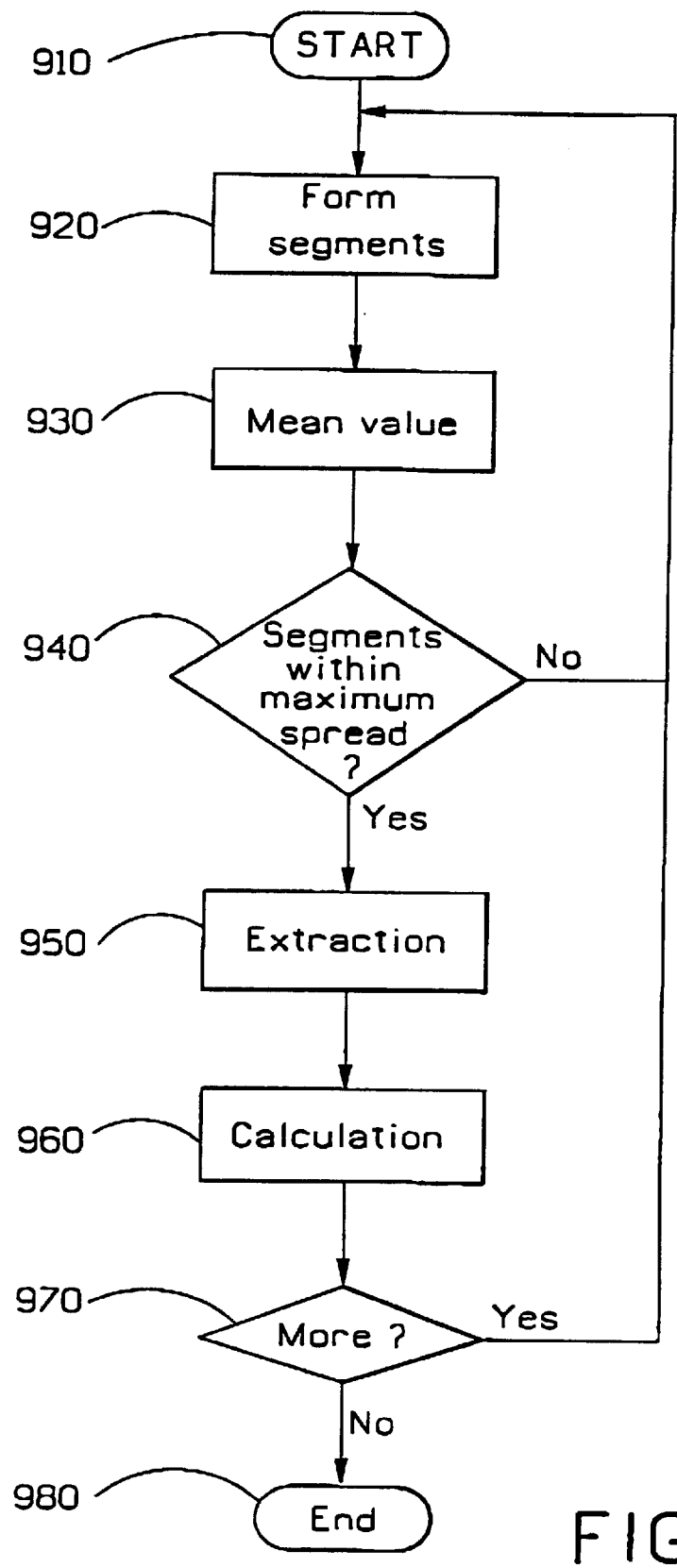
FIG. 9 shows a flow diagram of a deviation detection method according to the invention.

FIG. 9 shows a flow diagram of a variation of a method according to the invention. The method begins with a start step 910 which can be a procedure call and/or initialisation of variables or the like at the start of the procedure. Then comes a segment step 920 which forms/creates segments with a predetermined length of phase changes. The forming of segments can occur for example with the aid of a series to parallel converting function which includes a shift register function. For each new segment which is formed, a new phase change is shifted into the shift register function and a segment with the predetermined length is extracted therefrom. A mean value of all the phase changes in a segment is formed, possibly in an optional mean value step 930. The optionally formed mean value is then used possibly in a segment testing step 940 which checks whether the formed segment is a phase-linear segment.

The segment testing step 940 tests if each phase change which is included in the segment lies within a determined maximum spread from each other or the optionally calculated mean value. If at least one phase change value lies outside the determined maximum spread, the segment is judged as non-phase-linear and the procedure thereby returns to the forming step 920 in order to form a new segment. If on the other hand all the phase change values in the segment lie within the maximum allowed spread, it is judged that the segment is a phase-linear segment and the procedure continues on to an extraction step 950. The extraction step 950 extracts one or several of the phase change values closest to the middle in order to reduce the effect of intersymbol interference (see above).

The calculation step 960 uses these phase change values closest to the middle in order to be able to make a determination of phase change assignation and thereafter a calculation of the deviation, the deviation error and a deviation error constant. Then in a test step 970 a test is made as to whether several phase-linear segments should be filtered-out. If this is the case, the procedure continues to the segment step 920 after the test step 970. If on the other hand no more phase-linear segments are to be filtered-out the procedure continues to a stop step 980 which may possibly clear and reset variables and registers and allow the hardware to perform entirely different calculations.

The principles of the basic invention have so far only been described during ideal conditions Deviation detection with low signal/noise ratios may require that the detection principles described in connection with FIGS. 8 and 9 have to be improved in order to obtain a reliable detection. With the aid of one or more of the following further developments of the invention, the reliability of the detection can be improved.

A further development which improves the reliability of the detection is to calculate the mean value of a number of phase changes when forming segments. Since phase-linear sequences are being searched for, a smaller spread in phase change per symbol is obtained if the phase changes are calculated as mean values over a plurality of phase changes. One danger is however that the difference between phase-linear and other phase tree segments is reduced, which can lead to nearly-phase-linear sequences being detected as truly phase-linear. It turns out that, in a deviation detector, it is optimal to use the mean value over two phase changes during formation/creation of segments.

Since noise also gives a spread of the phase changes within phase-linear phase tree segments, the range of maximum allowable spread within the phase-linear segments has to be increased in order that a detection of these is able to occur. If the maximum allowable spread of phase changes within a segment is not sufficiently large, it may happen that also truly phase-linear segments are thrown out since noise spreads out the phase changes in the segments. If the maximum allowable spread is increased, this can mean that segments from sequences in the phase tree which are nearly phase-linear can be detected as truly phase-linear. Since signal-adapted filters normally have low pass characteristics, fast changes will disappear. A nearly phase-linear segment such as 45-45-0-45-45-0-45-45 degrees will therefore, after a signal-adapted filter, become additionally phase-linear, for example 35-35-20-35-35-20-35-35 degrees. Erroneous detection due to this can be reduced by either one or both of the following further developments of the invention.

A further development of the invention is to make the limit for maximum allowable spread proportional to the size of the phase changes occurring in a detected phase tree segment. If the phase changes per symbol in a segment are large, a large spread is allowed and if the phase changes per symbol are small, only a small spread is allowed. A segment with phase changes of around 90° per symbol can for example be allowed a spread of 10 degrees within the segment in order to be approved as being phase-linear whilst a segment with phase changes of around 60° per symbol for example is only allowed a spread of 6 degrees within the segment. This means that the truly phase-linear segments are allowed to have a larger spread within a segment than the nearly phase-linear ones since the nearly phase-linear ones according to the modulation method in this example have a lower phase change per symbol. If the deviation is such that truly phase-linear segments (i.e. those which nominally belong to the phase-linear +90 or −90 degrees sequences) have phase changes of around 50°, nearly phase-linear segments will have phase changes of around 30°. The nearly phase-linear sequences initially have a larger spread than truly phase-linear ones, for which reason they will therefore be suppressed more effectively during the detection.

Figure 10A:
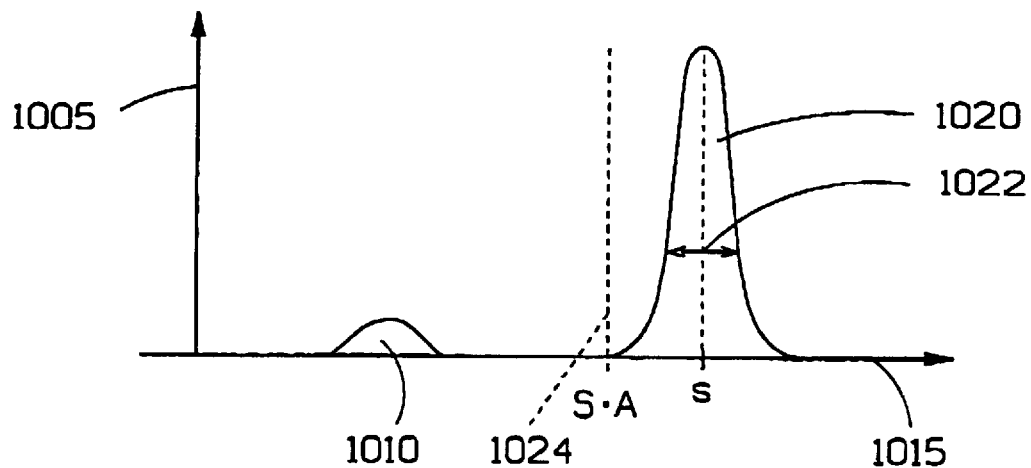
FIG. 10A shows a frequency function for filtering away of nearly phase-linear segments.
Figure 10B:
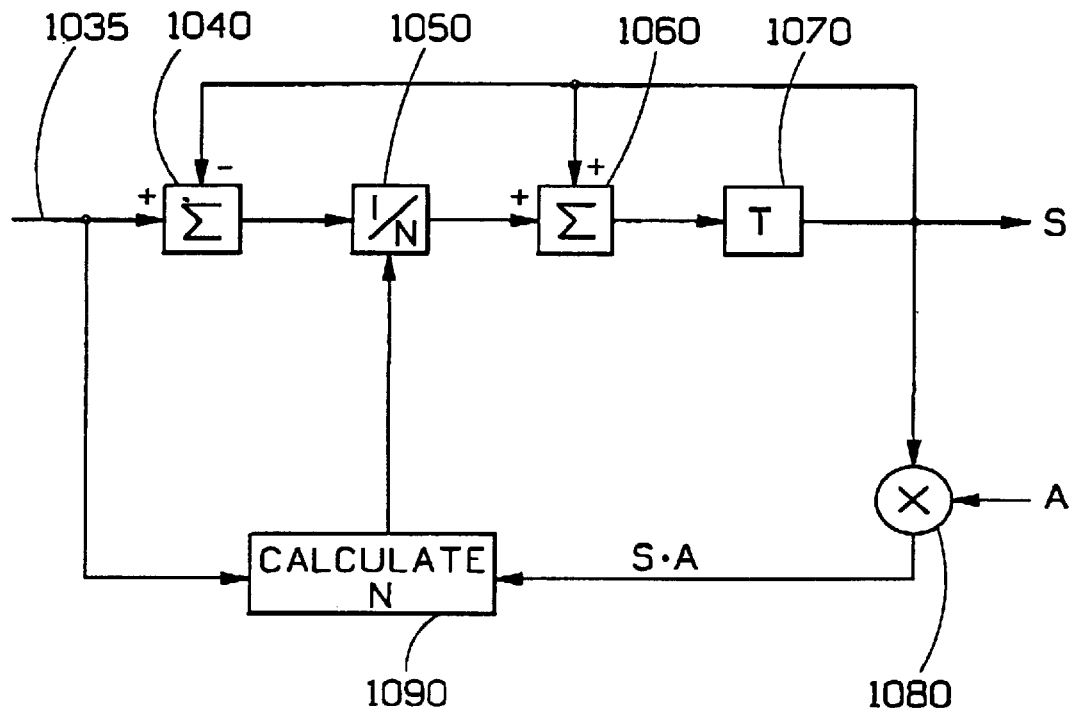
FIG. 10B shows a maximum-group filter for filtering-out near phase-linear segments.

In order to additionally improve the suppression of nearly phase-linear segments, the invention can be further developed with a tracking filter for the detected phase change values (maximum-group filter). FIG. 10A shows the result as a frequency function for the detected phase change values from approved phase-linear segments including erroneous detections of nearly phase-linear phase-tree segments. FIG. 10B shows a block diagram of a maximum-group filter for reducing the detector influence from these erroneous detections. FIGS. 10A and 10B only show the case for positive phase change segments but of course the same can also be done for negative phase change segments.

In FIG. 10A the Y-axis 1005 indicates number of phase change detections and the X-axis 1015 indicates detected phase change per symbol. The figure shows the frequency function for erroneous detections 1010 of phase-linear segments (those which belong to any nearly phase-linear sequence) and the frequency function for detections 1020 of truly phase-linear segments (those which belong to +90 degrees phase-linear sequences). The noise deviation 1022 which occurs due to a noisy information transfer environment and a line 1024 where the filter function according to FIG. 10B operates is also indicated in FIG. 10A.

The maximum-group filter in FIG. 10B takes in detected phase changes 1035 either from, for example according to FIG. 8, the evaluation 830 or the extraction 840. The output signal S is subtracted from the detected phase changes 1035 in a subtracter 1040 whose output signal is divided with a division factor N in a divider 1050. The divider's 1050 output signal is added in an accumulator 1060 to the output signal S of the filter. The output signal S of the accumulator is delayed one symbol time in a register 1070. The output signal of the register 1070 forms the output signal S of the filter. The output signal S of the filter is multiplied in a multiplier 1080 by a constant A in order to then be supplied to a calculation unit 1090. The calculation unit 1090 also uses the detected phase changes 1035 for calculating the division factor N which is used in the divider 1050. If the input signal to the filter, a detected phase change 1035, is larger than or equal to the output signal from the multiplier, S·A, then the division factor N is made equal to a constant B. On the other hand, if the input signal to the filter, a detected phase change 1035, is less than the output signal from the multiplier, S·A, then the division factor N is made equal to a constant C.

By choosing the time constant B<<C and the constant A (<1, typically about 0.8) in such a way that S·A is less than the maximum-group (detected truly phase-linear segments including noise) but larger than the nearly phase-linear segments, these nearly phase-linear segments will be suppressed at the same time as the noise deviation within the maximum-group can be reduced by the selection of the time constant B. It has been shown that C should be of the order of 10–10000 times larger than B and typically B can be equal to 64 and C equal to 4096. The same type of filtering is done for negative detector values. The factor A can be replaced by a constant reduction of the filter value S.

If the deviation is detected with the aid of very long phase-linear segments at the same time as the detection in, for example, a noisy environment is improved with the aid of a maximum-group filter according to the above, the detector's time constant becomes unfavourably large.

This can be fixed by dividing up the detection into a coarse detection and a fine detection. The coarse detection in such cases occurs by said principle with a maximum-group filter but with shorter phase-linear segments. This gives more detection results and therefore shorter and faster rise times for the maximum-group filter. The fine detection uses longer phase-linear segments.

For the fine detection, the obtained value from the maximum-group filter is used (+ and − respectively, which is a rough measure of the actual deviation for the 90 degrees phase changes). The value is multiplied by a constant D (<1, typically 0.75, or reduced by a constant value) and is used as a threshold for simultaneously detecting if the consecutive phase changes per symbol are larger than this threshold and therefore a part of a 90 degrees per symbol phase-linear sequence. The fine detection is carried out with phase-linear segments having the original segment length requirement in order that an accurate deviation can be calculated.

Since a large part of the method is preferably carried out digitally, an advantageous implementation of the method can be to implement the, according to the method, digital signal processing in one or possibly more integrated circuits of a standard type or a customer-specified type or a mixture of these. If the information rate is sufficiently low the implementation of the, according to the method, digital signal processing can also be envisaged in a processor device with associated program and data memory. The processor device can of course comprise a conventional processor or a dedicated signal processor (DSP—Digital Signal Processor).

The invention is particularly suited in those cases where the modulated information-carrying signal is within the microwave range or higher.

The invention is not limited to the embodiments mentioned above, but can be varied within the scope of the following claims.

What is claimed is:

1. A method for deviation determination of a phase shift modulated signal which is modulated according to a modulation method for generating a sequence of phase changes having consecutively the same phase change, the method comprising the following steps:

filtering out segments with at least three consecutive values which correspond to phase changes from the phase shift modulated signal, evaluating each filtered-out segment as to whether the segment's consecutive values are effectively the same and if a filtered-out segment's consecutive values are effectively the same, creating a phase-linear segment, otherwise rejecting the filtered-out segment, assigning a phase-linear segment's phase change to a nominal phase change possessed by a phase-linear sequence that a phase-linear segment is judged to be a part of, and determining the deviation from nominal phase changes assigned to created phase-linear segments' phase changes and from phase-linear segments' consecutive values.

2. The method according to claim 1, also comprising the following steps:

evaluating filtered-out segments as to whether they belong to a phase-linear sequence whose phase change per symbol is zero degrees and if a filtered-out segment belongs to a phase-linear sequence whose phase change per symbol is zero degrees rejecting the filtered-out segment.

3. The method according to claim 1, wherein the determination of the deviation occurs in two steps, a rough determination and a precise determination.

4. A method for determining a correction signal based on a deviation of a modulated information-carrying signal, the correction signal being related to the deviation for correcting deviation errors upon transferring an information-carrying signal between a transmitter, where the modulated information-carrying signal is generated with the aid of the information-carrying signal by a method for generating sequences of phase changes having consecutively the same phase change, and a receiver for phase demodulation which demodulates the modulated information-carrying signal whereby a demodulated signal is created, the method comprising the following steps:

filtering segments with at least three consecutive values which correspond to phase changes out of the modulated information-carrying signal, evaluating each segment's consecutive values as to whether they are effectively the same and if a segment's consecutive values are effectively the same, creating a phase-linear segment, otherwise rejecting the segment, assigning a phase-linear segment's phase change to a nominal phase change possessed by a sequence of phase changes that the phase-linear segment is judged to be a part of, determining the correction signal from phase change assignations of phase-linear segments and the phase-linear segments' consecutive values.

5. The method according to claim 4, further comprising the following steps:

evaluating filtered segments as to whether they belong to a phase-linear sequence whose phase changes per symbol are zero degrees and if a filtered segment belongs to a phase-linear sequence whose phase change per symbol is zero degrees, rejecting the segment.

6. The method according to claim 4, wherein deviation errors of the modulated information-carrying signal are corrected in the receiver and the method also comprises the following steps:

differentiating the demodulated signal to thereby create an instantaneous frequency value, multiplying the instantaneous frequency value by the correction signal to thereby create an amplitude-scaled signal, integrating the amplitude-scaled signal to thereby create a scaled phase signal, phase demodulating the scaled phase signal to thereby recreate a copy of the information-carrying signal.

7. The method according to claim 6, wherein the filtering step is carried out with the aid of the amplitude-scaled signal.

8. The method according to claim 6, wherein the filtering step is carried out with the aid of the scaled phase signal.

9. The method according to claim 6, wherein the filtering step is carried out with the aid of the amplitude-scaled signal and the scaled phase signal.

10. The method according to claim 4, wherein whether a segment's consecutive values are effectively the same is evaluated based on a maximum spread of the values allowed in the segment.

11. The method according to claim 10, wherein the maximum spread is proportional to the values in the segment.

12. The method according to claim 10, wherein the maximum spread is based on a mean value of all the values which correspond to phase changes in the segment.

13. The method according to claim 12, wherein the maximum spread is proportional to the mean value of values which correspond to phase changes in the segment.

14. The method according to claim 4, wherein the correction signal is determined with the aid of at least one value in the middle of at least one phase-linear segment.

15. The method according to claim 4, wherein each value which corresponds to a phase change that is used for the filtering step is a mean value of at least two values which correspond to phase changes.

16. The method according to claim 4, wherein phase-linear segments which belong to nearly phase-linear sequences and which have therefore been erroneously created as phase-linear segments are filtered away by a maximum-group filter.

17. The method according to claim 4, wherein information about the correction signal is transferred from the receiver to the transmitter of the modulated information-carrying signal via a data channel.

18. The method according to claim 4, wherein the demodulated signal is analogue/digital converted, whereby all signal processing thereafter according to the method occurs digitally and is implemented in at least one integrated circuit.

19. A device for determining a deviation of a phase shift modulated signal which is modulated according to a modulation method for generating sequences of phase changes having consecutively the same phase change, comprising:

means for filtering out, from the phase shift modulated signal, segments with at least three consecutive values which correspond to phase changes, means for evaluating whether the consecutive values in filtered-out segments are effectively the same and if the consecutive values in a filtered-out segment are effectively the same, creating a phase-linear segment, and if not rejecting the segment, means for assigning a phase-linear segment's phase change to a nominal phase change possessed by the phase-linear sequence that the phase-linear segment is judged to be a part of, means for determining the deviation from phase change assignations of phase-linear segments and the phase-linear segments' consecutive values.

20. The device according to claim 19, further comprising means for evaluating whether filtered-out segments belong to a phase-linear sequence whose phase changes per symbol are zero degrees and if a segment belongs to a phase-linear sequence whose phase changes per symbol are zero degrees rejecting the segment.

21. A device for determining a deviation of a modulated information-carrying signal and creating a correction signal related to the deviation for correcting deviation errors upon transferring an information-carrying signal between a transmitter, where the modulated information-carrying signal is generated with the aid of a voltage controlled oscillator and the information-carrying signal by a method for generating sequences of phase changes having consecutively the same phase change, and a receiver where a demodulated information-carrying signal is created, the device comprising:

means for filtering out, from the modulated information-carrying signal, segments with at least three consecutive values which correspond to phase changes, means for evaluating whether the consecutive values in each segment are effectively the same and, if the values in a segment are effectively the same, creating a phase-linear segment, and if not, rejecting the segment, means for assigning a phase change of a phase-linear segment to a nominal phase change possessed by the sequence that the phase-linear segment is judged to be a part of, means for determining the correction signal from phase change assignations of the phase-linear segments and the phase-linear segments' consecutive values.

22. The device according to claim 21, further comprising:

means for evaluating whether a segment is part of a phase-linear sequence whose phase changes per symbol are zero degrees and, if a segment belongs to a phase-linear sequence whose phase changes per symbol are zero degrees, rejecting the segment.

23. The device according to claim 21, wherein the device is arranged in the receiver and where the receiver comprises:

means for quadrature demodulating the modulated information-carrying signal to thereby create the demodulated information-carrying signal, means for taking a derivative of the demodulated information-carrying signal to thereby create an instantaneous frequency value, means for multiplying the instantaneous frequency value with the correction signal to thereby create an amplitude-scaled signal, means for integrating the amplitude-scaled signal to thereby create a scaled phase signal, means for phase demodulating the scaled phase signal to thereby recreate a copy of the information-carrying signal.

24. The device according to claim 23, wherein the filtering-out means filters out segments with the aid of the amplitude-scaled signal.

25. The device according to claim 23, wherein the filtering-out means filters out segments with the aid of the scaled phase signal.

26. The device according to claim 23, wherein the filtering-out means filters out segments with the aid of the amplitude-scaled signal and the scaled phase signal.

27. The device according to claim 21, wherein the evaluation of whether the consecutive values which correspond to phase changes are effectively the same is based on a determined maximum spread of values which correspond to phase changes allowed in the segment.

28. The device according to claim 27, wherein the maximum spread of values is proportional to the values which correspond to phase changes in the segment.

29. The device according to claim 27, wherein the maximum spread of values which are allowed in the segment is based on a mean value of all the values which correspond to phase changes in the segment.

30. The device according to claim 29, wherein the maximum spread of values is proportional to the mean value of the values which correspond to phase changes in the segment.

31. The device according to claim 21, wherein the deviation is determined with the aid of at least one value in the middle of the phase-linear segment.

32. The device according to claim 21, wherein each value used in filtering-out a segment is a mean value of at least two values which correspond to phase changes.

33. The device according to claim 21, further comprising a maximum-group filter arranged to filter away phase-linear segments which belong to nearly phase-linear sequences and therefore were erroneously created as phase-linear segments.

34. The device according to claim 21, wherein the deviation is determined in two steps, a rough determination and a precise determination, where the rough determination uses short phase-linear segments and the precise determination uses longer phase-linear segments.

35. The device according to claim 21, wherein the receiver comprises means for analogue/digital converting the demodulated information-carrying signal, whereby all signal processing thereafter occurs digitally and is implemented in at least one integrated circuit.

36. The device according to claim 21, wherein the receiver comprises means for analogue/digital converting the demodulated information-carrying signal, whereby all signal processing thereafter occurs digitally and is implemented with a processor device comprising calculation means and memory means.

37. The device according to claim 21, wherein the receiver comprises means for transferring information about the correction signal to the transmitter of the modulated information-carrying signal.

38. A system for use in transferring an information-carrying signal between a transmitter, where a modulated information-carrying signal with a frequency which is in the microwave region or higher, is generated with the aid of a voltage-controlled oscillator and the information-carrying signal with a method for generating sequences of phase changes with consecutively the same phase change, and a receiver for coherent phase demodulation which demodulates the modulated information-carrying signal, whereby a demodulated signal is created, where the system is for correcting, in the receiver, deviation errors, which have originated in the transmitter, the system comprising:

means for analogue-digital converting the demodulated signal, means for differentiating the analogue-digital converted demodulated signal to thereby create an instantaneous frequency value, a deviation detector for determining a deviation of the modulated information-carrying signal and creating a correction signal which is related to the deviation, means for multiplying the instantaneous frequency value with the correction signal to thereby create an amplitude-scaled signal, means for integrating the amplitude-scaled signal to thereby create a scaled phase signal, and means for phase demodulating the scaled phase signal to thereby recreate a copy of the information-carrying signal, wherein the deviation detector comprises:

means arranged to filter-out, from the modulated information-carrying signal, segments with at least three consecutive values which correspond to phase changes, means arranged to evaluate whether the segments belong to a phase-linear sequence whose phase change per symbol is zero degrees and if a segment belongs to a phase-linear sequence whose phase change per symbol is zero degrees, to reject the segment, means arranged to evaluate whether the consecutive values which correspond to phase changes in a segment are effectively the same and, if the values which correspond to phase changes in a segment are effectively the same, to create a phase-linear segment and, if not, to reject the segment, means arranged to assign a phase-linear segment's phase change to a nominal phase change which is possessed by the sequence of phase changes that the phase-linear segment is judged to be a part of, means arranged to calculate the correction signal from phase-linear segments' phase change assignations and the phase-linear segments' consecutive values, and segments are filtered out from the modulated information-carrying signal with the aid of at least one of the scaled phase signal and the amplitude-scaled signal, and digital signal processing which is performed by the system is implemented in at least one integrated circuit.

\* \* \* \* \*